(12) United States Patent
Yanai et al.

(10) Patent No.: US 12,199,210 B2
(45) Date of Patent: Jan. 14, 2025

(54) OPTICAL SEMICONDUCTOR ELEMENT

(71) Applicant: HAMAMATSU PHOTONICS K.K., Hamamatsu (JP)

(72) Inventors: Takahide Yanai, Hamamatsu (JP); Daisuke Iida, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 148 days.

(21) Appl. No.: 17/965,090

(22) Filed: Oct. 13, 2022

(65) Prior Publication Data
US 2023/0118125 A1   Apr. 20, 2023

(30) Foreign Application Priority Data

Oct. 18, 2021   (JP) ................. 2021-170201

(51) Int. Cl.
*H01L 31/167*   (2006.01)
*H01L 31/107*   (2006.01)
*H01L 31/105*   (2006.01)

(52) U.S. Cl.
CPC ........ *H01L 31/167* (2013.01); *H01L 31/1075* (2013.01); *H01L 31/1055* (2013.01)

(58) Field of Classification Search
CPC ............... H01L 31/167; H01L 31/1075; H01L 31/1055; H01L 31/1035; H01L 31/035281;
(Continued)

(56) References Cited

U.S. PATENT DOCUMENTS

| 10,411,146 B1* | 9/2019 | Ariyawansa .......... H01L 31/105 |
| 2013/0070452 A1* | 3/2013 | Urano .................. H05K 1/0203 362/249.02 |

(Continued)

FOREIGN PATENT DOCUMENTS

| CN | 109817781 A | 5/2019 |
| JP | 2014-116604 A | 6/2014 |

(Continued)

OTHER PUBLICATIONS

E. Delli et al., "Heteroepitaxial Integration of Mid-Infrared InAsSb Light Emitting Diodes on Silicon," in IEEE Photonics Journal, vol. 11, No. 3, pp. 1-8, Jun. 2019, Art No. 2200608, doi: 10.1109/JPHOT.2019.2911433 (Year: 2019).*

(Continued)

*Primary Examiner* — Sitaramarao S Yechuri
(74) *Attorney, Agent, or Firm* — Faegre Drinker Biddle & Reath LLP (57) ABSTRACT

An optical semiconductor element includes a substrate and a plurality of cells. Each cell includes an optical layer, a first semiconductor layer, and a second semiconductor layer. The plurality of cells include a first cell and a second cell. The second semiconductor layer of the first cell and the first semiconductor layer of the second cell are electrically connected to each other by a first connection portion of a first wiring portion. The first wiring portion has a first extending portion that extends from the first connection portion so as to surround four side portions of the optical layer of the first cell. The optical layer is an active layer that generates light having a central wavelength of 3 μm or more and 10 μm or less or an absorption layer having a maximum sensitivity wavelength of 3 μm or more and 10 μm or less.

18 Claims, 7 Drawing Sheets

(58) Field of Classification Search
CPC ......... H01L 33/38; H01L 33/58; H01L 33/62; H01L 27/15
See application file for complete search history.

(56) References Cited

U.S. PATENT DOCUMENTS

2020/0161502 A1* 5/2020 Deliwala ............... H01L 33/644
2020/0243598 A1   7/2020 Chiu et al.

FOREIGN PATENT DOCUMENTS

| JP | 2014-131041 A | 7/2014 |
| JP | 2015-023293 A | 2/2015 |
| JP | 2015-133386 A | 7/2015 |

OTHER PUBLICATIONS

Y. Wang, K. Zheng, F. Song, F. K. Tittel and C. Zheng, "Mid-Infrared Absorption Spectroscopy for Gas Sensing and Application," 2020 IEEE 5th Optoelectronics Global Conference (OGC), Shenzhen, China, 2020, pp. 80-82, doi: 10.1109/OGC50007.2020.9260421 (Year: 2020).*
English-language translation of International Preliminary Report on Patentability (IPRP) dated May 2, 2024 that issued in WO Patent Application No. JP2022/038741.

* cited by examiner

OPTICAL SEMICONDUCTOR ELEMENT

TECHNICAL FIELD

One aspect of the present disclosure relates to an optical semiconductor element.

BACKGROUND

Japanese Unexamined Patent Publication No. 2015-23293 describes a light emitting element that emits visible light or ultraviolet light. In the light emitting element, a plurality of light emitting cells each having an active layer are formed on the substrate, and two adjacent light emitting cells are electrically connected to each other by a bridge electrode.

Unlike the light emitting element described above, it is conceivable to configure the light emitting element so as to emit infrared light having a wavelength longer than, for example, 3 µm. In this case, the carriers are likely to be inactivated, and the efficiency of carrier injection into the active layer may be reduced. In addition, in such a light emitting element, it is difficult to increase the area of the element from the viewpoint of cost, and it is important to increase the light emission efficiency per unit area. These are the same for a light receiving element that receives infrared light having a wavelength longer than 3 µm. In such a light receiving element, the efficiency of carrier extraction from the absorption layer may be reduced, and it is important to increase the light reception efficiency per unit area.

SUMMARY

One aspect of the present disclosure is to provide an optical semiconductor element capable of suppressing a reduction in carrier injection/extraction efficiency and increasing the light emission/receiving efficiency per unit area.

An optical semiconductor element according to an aspect of the present disclosure includes: a substrate; and a plurality of cells formed on the substrate. Each of the plurality of cells includes an optical layer that is an active layer for generating light or an absorption layer for absorbing light, a first semiconductor layer arranged on a side opposite to the substrate with respect to the optical layer, and a second semiconductor layer arranged on a side of the substrate with respect to the optical layer. The optical layer is formed in a rectangular shape when viewed from a thickness direction of the substrate, and has four side portions. The plurality of cells include a first cell and a second cell, and the second semiconductor layer of the first cell and the first semiconductor layer of the second cell are electrically connected to each other by a first connection portion of a first wiring portion. The first wiring portion includes a first extending portion that extends from the first connection portion so as to surround the four side portions of the optical layer of the first cell when viewed from the thickness direction of the substrate. The optical layer is the active layer that generates light having a central wavelength of 3 µm or more and 10 µm or less or the absorption layer having a maximum sensitivity wavelength of 3 µm or more and 10 µm or less.

In the optical semiconductor element, the optical layer is an active layer that generates light having a central wavelength of 3 µm or more and 10 µm or less or an absorption layer having a maximum sensitivity wavelength of 3 µm or more and 10 µm or less. In this case, as described above, the carrier injection/extraction efficiency may be reduced, and it is important to increase the light emission/receiving efficiency (light emission efficiency or light reception efficiency) per unit area. In this respect, in the optical semiconductor element, a plurality of cells are formed on the substrate. Therefore, for example, compared with a case where only one cell is formed on the substrate, the size of one cell can be reduced. As a result, it is possible to suppress a reduction in carrier injection/extraction efficiency (carrier injection efficiency or carrier extraction efficiency). In addition, the optical layer of each cell is formed in a rectangular shape when viewed from the thickness direction of the substrate. Therefore, a plurality of cells can be efficiently arranged on the substrate, and it is possible to increase the light emission/receiving efficiency per unit area. In addition, in the optical semiconductor element, the first wiring portion includes the first connection portion that electrically connects the second semiconductor layer of the first cell and the first semiconductor layer of the second cell to each other and the first extending portion that extends so as to surround the four side portions of the optical layer of the first cell when viewed from the thickness direction of the substrate. Therefore, it is possible to more effectively suppress the reduction in carrier injection/extraction efficiency. Therefore, according to the optical semiconductor element, it is possible to suppress a reduction in carrier injection/extraction efficiency and increase the light emission/receiving efficiency per unit area.

The plurality of cells may further include a third cell. The second semiconductor layer of the second cell and the first semiconductor layer of the third cell may be electrically connected to each other by a second connection portion of a second wiring portion. The second wiring portion may have a second extending portion that extends from the second connection portion so as to surround the four side portions of the optical layer of the second cell when viewed from the thickness direction of the substrate. The first connection portion of the first wiring portion may not overlap the second extending portion of the second wiring portion when viewed from the thickness direction of the substrate. In this case, it is possible to avoid a situation in which the first wiring portion and the second wiring portion overlap each other to generate a capacitance.

The plurality of cells may be electrically connected in series. In this case, when the optical semiconductor element is a light emitting element and the optical layer is an active layer, it is possible to suppress an increase in the amount of current required for driving the plurality of cells, and it is possible to make the amount of current applied to each cell uniform. In addition, for example, when a plurality of cells are connected in parallel, there is a place where the wiring portion cannot be formed so as to have an extending portion due to the wiring routing, and as a result, the carrier injection efficiency may be reduced. However, by connecting the plurality of cells in series, it is possible to suppress the occurrence of such a situation. Alternatively, when the optical semiconductor element is a light receiving element and the optical layer is an absorption layer, the resistance value of the optical semiconductor element can be set to a value suitable for connection with an amplifier connected subsequently. As a result, noise can be reduced. In addition, thermal noise can be reduced, and as a result, total noise can be reduced.

The plurality of cells may include a first termination cell arranged at one end in an electrical series connection and a second termination cell arranged at the other end in the electrical series connection. A first electrode electrically connected to the first semiconductor layer of the first termination cell may be arranged on a top surface of the first termination cell, and a second electrode electrically connected to the second semiconductor layer of the second termination cell may be arranged on a top surface of the second termination cell. In this case, all of the plurality of cells can be made to emit/receive light by electrical connection through the first electrode and the second electrode. As a result, it is possible to increase the light emission/receiving efficiency. In addition, since the first electrode is arranged on the top surface of the first termination cell and the second electrode is arranged on the top surface of the second termination cell, it is possible to easily connect an external circuit to the first electrode and the second electrode.

The second electrode may include a third extending portion that extends so as to surround the four side portions of the optical layer of the second termination cell when viewed from the thickness direction of the substrate. In this case, it is possible to suppress a reduction in carrier injection/extraction efficiency in the second termination cell.

The plurality of cells may include a dummy pad cell, and a dummy electrode electrically separated from the optical layer, the first semiconductor layer, and the second semiconductor layer of the dummy pad cell may be arranged on a top surface of the dummy pad cell. In this case, for example, by connecting the optical semiconductor element to the external member not only in the first electrode and the second electrode but also in the dummy electrode, it is possible to increase the connection strength between the optical semiconductor element and the external member, and it is possible to suppress the occurrence of a situation in which the angle between the optical semiconductor element and the external member deviates from the target angle at the time of connection.

The optical layer may be formed of a material containing Sb. In this case, the optical layer can be configured as an active layer that generates light having a central wavelength of 3 μm or more and 10 μm or less or an absorption layer having a maximum sensitivity wavelength of 3 μm or more and 10 μm or less.

The optical layer may be formed of a material containing Sb and In. In this case, the optical layer can be configured as an active layer that generates light having a central wavelength of 3 μm or more and 10 μm or less or an absorption layer having a maximum sensitivity wavelength of 3 μm or more and 10 μm or less.

The optical layer may be formed of a material containing at least one of InAsSb, AlInSb, and AlInAs. In this case, the optical layer can be configured as an active layer that generates light having a central wavelength of 3 μm or more and 10 μm or less or an absorption layer having a maximum sensitivity wavelength of 3 μm or more and 10 μm or less.

The substrate may have a light transmission property. When the optical layer is the active layer, light generated in the optical layer may be emitted through the substrate, and when the optical layer is the absorption layer, light incident through the substrate may be absorbed by the optical layer. In this case, light can be emitted or incident through the substrate.

The first extending portion may include four portions extending straight along the four side portions, respectively, when viewed from the thickness direction of the substrate. In this case, it is possible to more effectively suppress the reduction in carrier injection/extraction efficiency.

According to the present disclosure, it is possible to provide an optical semiconductor element capable of suppressing a reduction in carrier injection/extraction efficiency and increasing the light emission/receiving efficiency per unit area.

DETAILED DESCRIPTION

Hereinafter, an embodiment of the present disclosure will be described in detail with reference to the diagrams In the following description, the same or equivalent elements are denoted by the same reference numerals, and repeated description thereof will be omitted.

As shown in FIGS. 1 to 5, an optical semiconductor element 1 includes a substrate 2 and a plurality of (nine in this example) cells 3 formed on the substrate 2. Each cell 3 has an optical layer 31, a first semiconductor layer 32, and a second semiconductor layer 33. The optical semiconductor element 1 is a light emitting element or a light receiving element. In this example, the optical semiconductor element 1 is configured as a light emitting diode (LED), and the light generated in the optical layer 31 is emitted through the substrate 2.

The substrate 2 is a semiconductor substrate having a light transmission property, and is formed in a rectangular plate shape by, for example, GaAs or semi-insulating GaAs. The substrate 2 has a main surface 2a. Hereinafter, the thickness direction of the substrate 2 (direction perpendicular to the main surface 2a), the length direction of the substrate 2 (direction perpendicular to the Z direction), and the width direction of the substrate 2 (direction perpendicular to the Z direction and the X direction) will be described as a Z direction, an X direction, and a Y direction, respectively. The length of the substrate 2 (maximum length of the optical semiconductor element 1) in the X direction is, for example, 2 mm or less.

Figure 1:
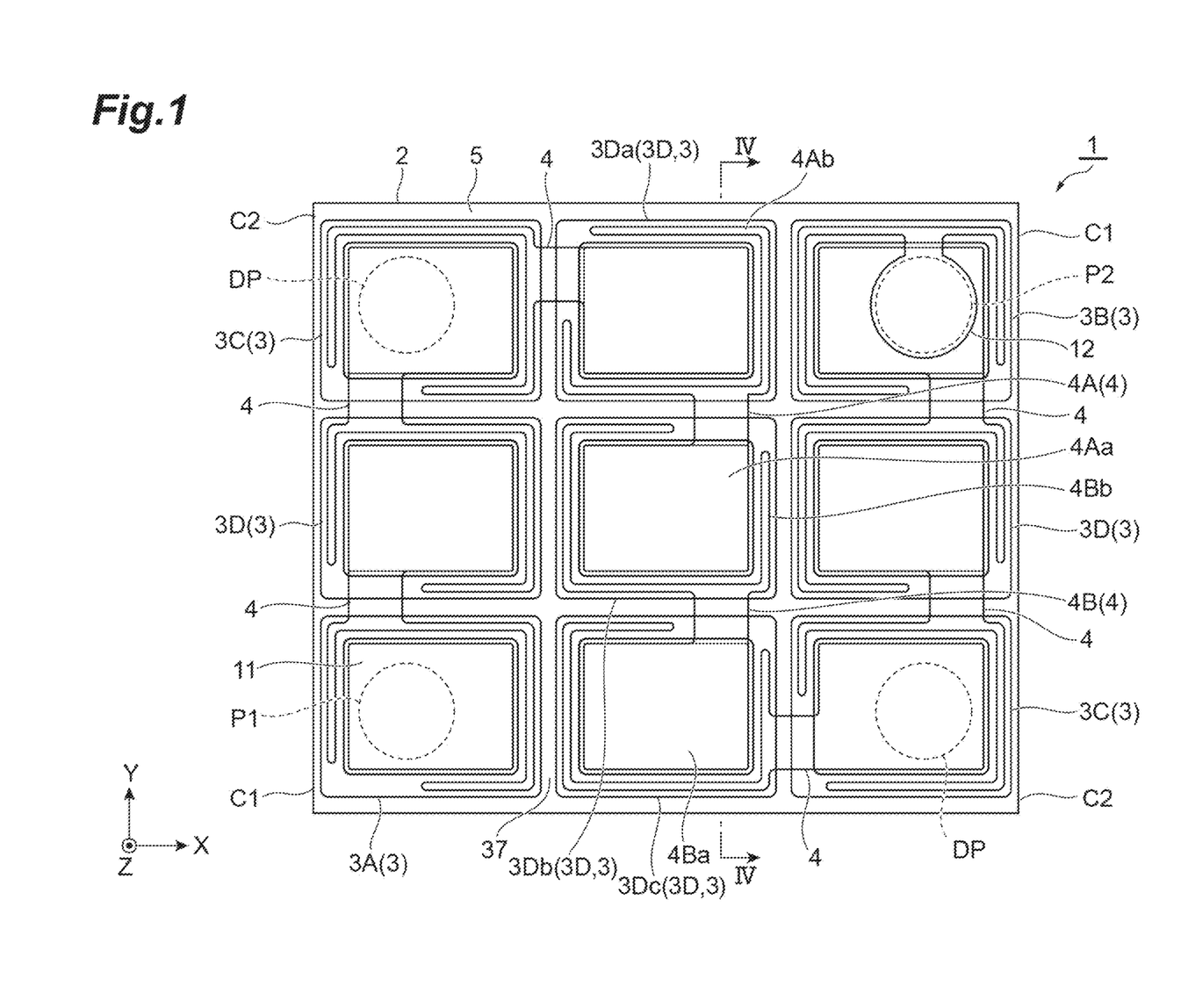
FIG. 1 is a plan view of an optical semiconductor element according to an embodiment.

The plurality of cells 3 include a first termination cell 3A, a second termination cell 3B, a pair of dummy pad cells 3C, and a plurality of (five in this case) cells 3D other than the first termination cell 3A, the second termination cell 3B, and the dummy pad cells 3C. The plurality of cells 3 are arranged in a grid pattern so that three cells are aligned along each of the X direction and the Y direction. When viewed from the Z direction, the first termination cell 3A and the second termination cell 3B are arranged at two corners C1 located diagonally on the substrate 2, and the pair of dummy pad cells 3C are arranged at the remaining two corners C2 located diagonally on the substrate 2. In the optical semiconductor element 1, a plurality of cells 3 are electrically connected in series (in multiple stages) via a wiring layer 4 described later, and light is emitted from each cell 3.

First, the configuration of the cell 3D will be described below. As described above, the cell 3D has the optical layer 31, the first semiconductor layer 32, and the second semiconductor layer 33. The second semiconductor layer 33, the optical layer 31, and the first semiconductor layer 32 are stacked in this order on the main surface 2a of the substrate 2. That is, the first semiconductor layer 32 is arranged on a side opposite to the substrate 2 (upper side in FIGS. 2 and 3) with respect to the optical layer 31, and the second semiconductor layer 33 is arranged on a side of the substrate 2 (lower side in FIGS. 2 and 3) with respect to the optical layer 31. The length of the cell 3D in the X direction (maximum length of the cell 3D) is, for example, 300 μm or less.

In this example, the optical layer 31 is an active layer that generates light, and is configured to generate light having a central wavelength of 3 μm or more and 10 μm or less. The optical layer 31 has, for example, a multiple quantum well structure in which a barrier layer formed of AlInAs and a well layer formed of InAsSb are alternately stacked. The optical layer 31 is formed in a rectangular shape when viewed from the Z direction, and has four straight side portions 31a. In this example, the optical layer 31 is formed in a rectangular shape having a long side along the X direction when viewed from the Z direction. The optical layer 31 may be formed in a square shape. In this example, the corners of the optical layer 31 and the cell 3D are sharp, but the corners of the optical layer 31 and the cell 3D may be rounded to have an R shape.

The first semiconductor layer 32 is a semiconductor layer of a first conductive type (for example, p-type). For example, the first semiconductor layer 32 is formed by stacking a barrier layer, a buffer layer, and a contact layer on the optical layer 31 in this order. The second semiconductor layer 33 is a semiconductor layer of a second conductive type (for example, n-type). For example, the second semiconductor layer 33 is formed by stacking a buffer layer, a contact layer, a current diffusion layer, and a barrier layer on the main surface 2a of the substrate 2 in this order. The material of each layer included in the first semiconductor layer 32 and the second semiconductor layer 33 can be appropriately selected depending on the material of the optical layer 31. As an example, the barrier layer of the first semiconductor layer 32 is formed of $Al_{0.20}InAs$, the buffer layer is formed of $Al_{0.05}InAs$, and the contact layer is formed of InAs. As an example, the buffer layer of the second semiconductor layer 33 is configured to include three layers of GaAs, GaSb, and InAs, the contact layer and the current diffusion layer are formed of $Al_{0.05}InAs$, and the barrier layer is formed of $Al_{0.20}InAs$.

The optical layer 31 and the first semiconductor layer 32 form a mesa portion 34 formed on the second semiconductor layer 33. The mesa portion 34 is formed, for example, in a trapezoidal shape in a cross section (FIG. 4) perpendicular to the main surface 2a of the substrate 2 so as to protrude from the second semiconductor layer 33 to the side opposite to the substrate 2. The mesa portion 34 is formed, for example, by stacking the optical layer 31, the first semiconductor layer 32, and the second semiconductor layer 33 on the substrate 2 and then removing parts of the substrate 2, the optical layer 31, the first semiconductor layer 32, and the second semiconductor layer 33 by etching. After forming the mesa portion 34, a groove portion 37 described later is formed.

The second semiconductor layer 33 has an outer portion 35 located outside the mesa portion 34. Here, the "outside" means the side away from the center of the mesa portion 34 in the direction perpendicular to the Z direction. The outer portion 35 is formed, for example, in a rectangular ring shape so as to surround the entire circumference of the mesa portion 34 when viewed from the Z direction.

Figure 2:
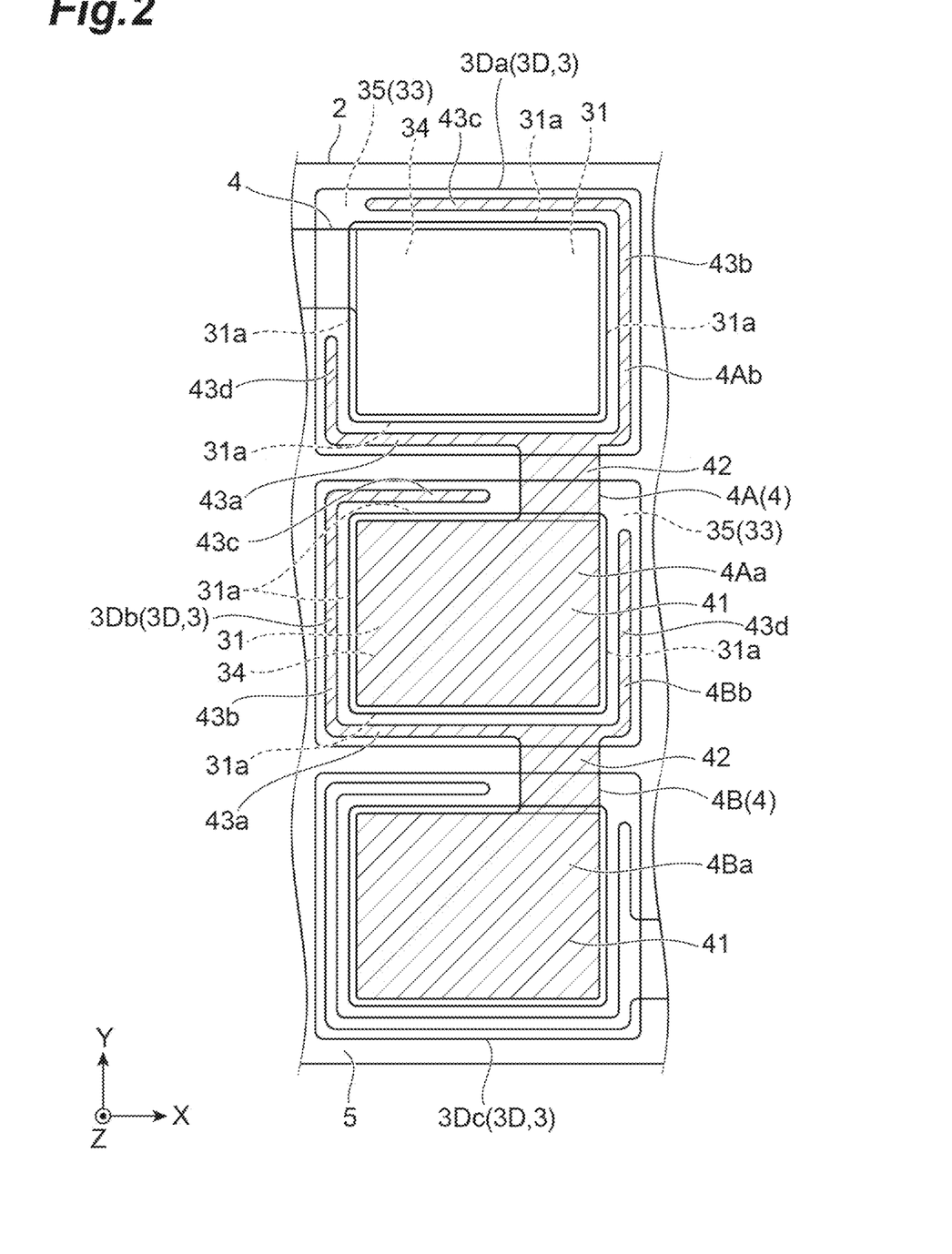
FIG. 2 is a partially enlarged view of FIG. 1.
Figure 4:
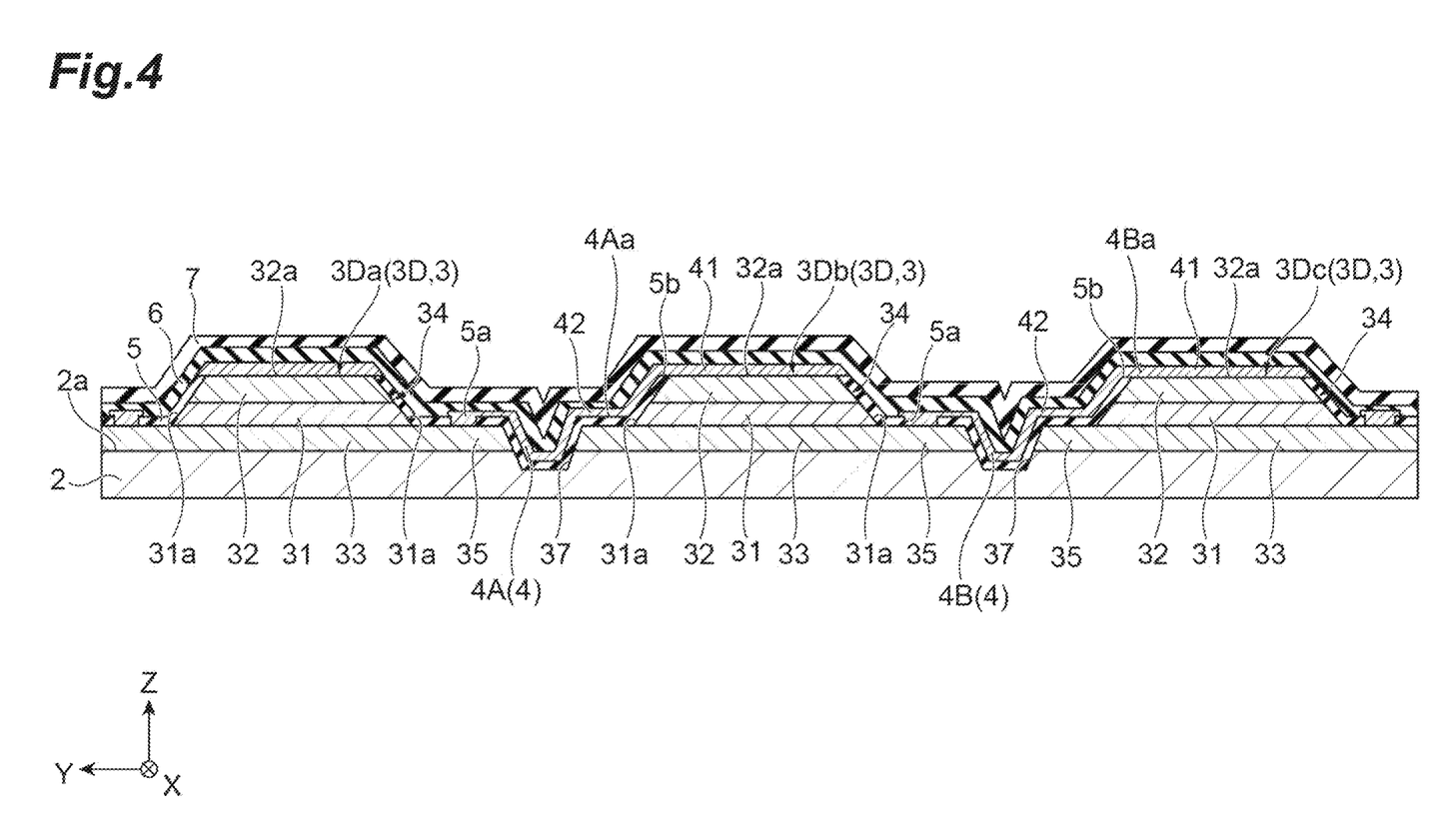
FIG. 4 is a cross-sectional view taken along the line IV-IV of FIG. 1.

FIGS. 2 and 4 show three cells 3D that are arranged in the Y direction so as to be electrically connected in series. Hereinafter, as shown in FIGS. 2 and 4, the three cells 3D will be described as a first cell 3Da, a second cell 3Db, and a third cell 3Dc, respectively.

The second semiconductor layer 33 of the first cell 3Da and the second semiconductor layer 33 of the second cell 3Db are separated by a groove 37 so as to be electrically separated from each other. Similarly, the second semiconductor layer 33 of the second cell 3Db and the second semiconductor layer 33 of the third cell 3Dc are separated by the groove 37 so as to be electrically separated from each other. As described above, in the optical semiconductor element 1, the second semiconductor layers 33 of the adjacent cells 3 are separated by the groove 37 so as to be electrically separated from each other. The groove portion 37 is formed in the second semiconductor layer 33, and extends, for example, in a grid pattern so as to pass between the adjacent cells 3 when viewed from the Z direction. In this example, the groove portion 37 is formed so as to reach the inside of the substrate 2 in the Z direction. However, the groove portion 37 only needs to electrically separate the second semiconductor layers 33 of the adjacent cells 3 from each other, and the groove portion 37 does not have to be formed so as to reach the inside of the substrate 2 in the Z direction.

The first cell 3Da and the second cell 3Db are electrically connected to each other by a first wiring layer 4A (wiring layer 4) (wiring portion). Similarly, the second cell 3Db and the third cell 3Dc are electrically connected to each other by a second wiring layer 4B (wiring layer 4) (wiring portion). As described above, in the optical semiconductor element 1, the wiring layer 4 realizes the electrical connection between the cells 3. The wiring layer 4 is formed, for example, by stacking a first layer formed of Ti, a second layer formed of Pt, and a third layer formed of Au, in this order from the substrate 2 side by vapor deposition. Hereinafter, the first wiring layer 4A and the second wiring layer 4B will be described, but the other wiring layers 4 (wiring portions) are similarly configured.

The first wiring layer 4A is formed on the first cell 3Da and the second cell 3Db via a first insulating layer 5. That is, the first insulating layer 5 is formed over the first cell 3Da and the second cell 3Db, and the first wiring layer 4A is formed on the first insulating layer 5. The first insulating layer 5 is formed of, for example, $Al_2O_3$, and is formed over the adjacent cells 3 and the inner surface of the groove 37 between the adjacent cells 3. A second insulating layer 6 is formed on the first insulating layer 5 and the first wiring layer 4A, and a third insulating layer 7 is formed on the second insulating layer 6. The second insulating layer 6 and the third insulating layer 7 are formed of, for example, $Al_2O_3$, and are formed over the entire surface of the substrate 2.

The first wiring layer 4A has a first connection portion 4Aa and a first extending portion 4Ab. The first connection portion 4Aa is electrically connected to the second semiconductor layer 33 of the first cell 3Da and the first semiconductor layer 32 of the second cell 3Db. More specifically, the first connection portion 4Aa is in contact with the outer portion 35 of the second semiconductor layer 33 of the first cell 3Da through an opening 5a, and is in contact with a surface 32a of the first semiconductor layer 32 of the second cell 3Db through an opening 5b. The openings 5a and 5b are openings formed in the first insulating layer 5. The surface 32a is a surface of the first semiconductor layer 32 on a side opposite to the optical layer 31, and forms a top surface of the mesa portion 34. The first connection portion 4Aa has a rectangular first portion 41 arranged on the surface 32a of the first semiconductor layer 32 of the second cell 3Db and a rectangular second portion 42 extending from the first portion 41 to reach the outer portion 35 of the second semiconductor layer 33 of the first cell 3Da. The first portion 41 is arranged on the approximately entire surface 32a. The width of the second portion 42 in the X direction is smaller than the width of the first portion 41 in the X direction.

Figure 3:
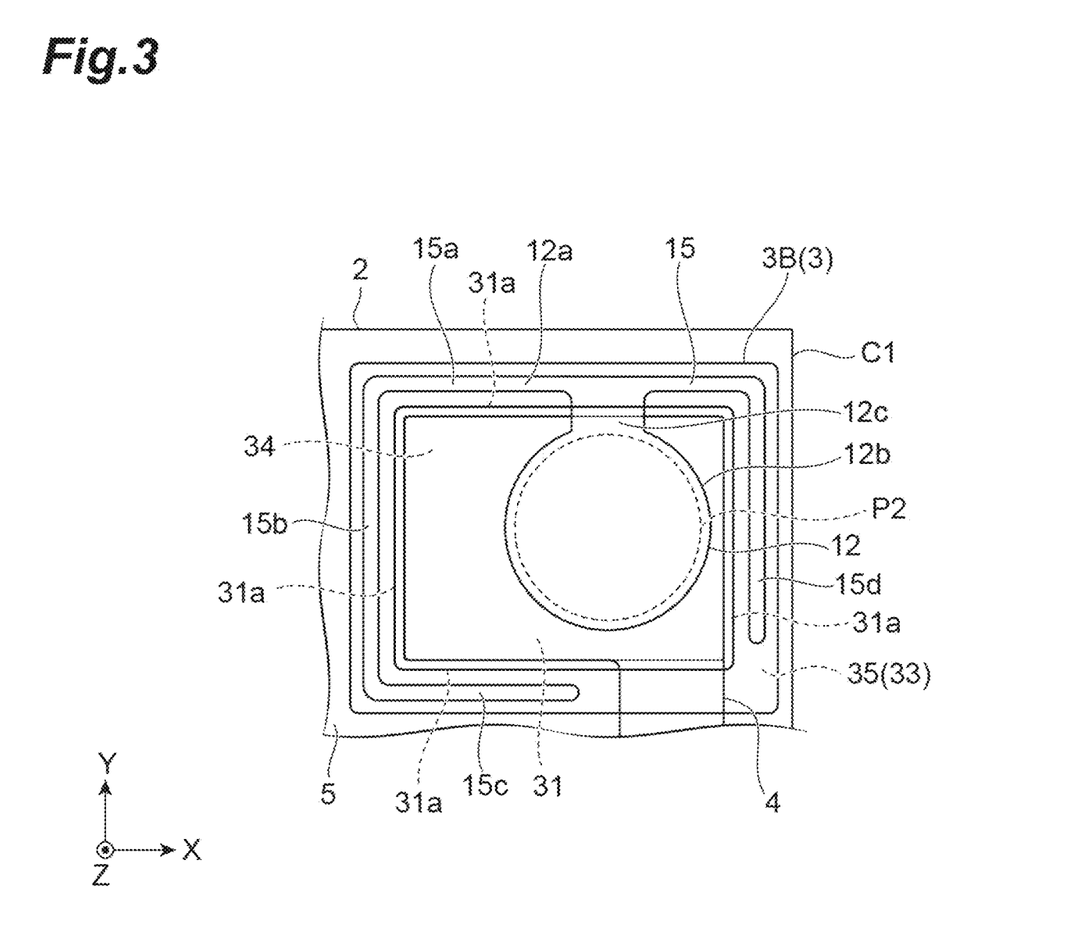
FIG. 3 is a partially enlarged view of FIG. 1.

As shown in FIG. 2, when viewed from the Z direction, the first extending portion 4Ab extends from the second portion 42 of the first connection portion 4Aa so as to surround the four side portions 31a of the optical layer 31 of the first cell 3Da. The first extending portion 4Ab is in contact with the outer portion 35 of the second semiconductor layer 33 of the first cell 3Da through the opening 5a. In FIGS. 1 to 3, for convenience of explanation, a state in which the first insulating layer 5, the second insulating layer 6, and the third insulating layer 7 are omitted and the wiring layer 4 is exposed is shown. In addition, in FIG. 2, the first wiring layer 4A and the second wiring layer 4B are hatched for easy understanding.

In this example, the first extending portion 4Ab has four portions 43a, 43b, 43c, and 43d extending straight along the four side portions 31a, respectively. The portion 43a is connected to the second portion 42 of the first connection portion 4Aa. The first end of the portion 43b is connected to the first end of the portion 43a, and the portion 43b extends perpendicular to the portion 43a. The portion 43c is connected to the second end of the portion 43b, and extends perpendicular to the portion 43b and parallel to the portion 43a. The portion 43d is connected to the second end of the portion 43a, and extends perpendicular to the portion 43a and parallel to the portion 43b. In this example, the portion 43d is not connected to the portion 43c, and a gap is formed between the portions 43c and 43d when viewed from the Z direction. That is, the first extending portion 4Ab partially surrounds the four side portions 31a of the optical layer 31 of the first cell 3Da, and does not surround the entire circumference of the optical layer 31 of the first cell 3Da. The first extending portion 4Ab extends along at least a part of each of the four side portions 31a when viewed from the Z direction. As will be described later, a connection portion of another wiring layer 4 is arranged in the gap between the portions 43c and 43d.

The second wiring layer 4B is formed on the second cell 3Db and the third cell 3Dc with the first insulating layer 5 interposed therebetween. The second wiring layer 4B has a second connection portion 4Ba and a second extending portion 4Bb. The second connection portion 4Ba is electrically connected to the second semiconductor layer 33 of the second cell 3Db and the first semiconductor layer 32 of the third cell 3Dc. More specifically, the second connection portion 4Ba is in contact with the outer portion 35 of the second semiconductor layer 33 of the second cell 3Db through the opening 5a, and is in contact with the surface 32a of the first semiconductor layer 32 of the third cell 3Dc through the opening 5b. The second connection portion 4Ba has a rectangular first portion 41 arranged on the surface 32a of the first semiconductor layer 32 of the third cell 3Dc and a rectangular second portion 42 extending from the first portion 41 to the outer portion 35 of the second semiconductor layer 33 of the second cell 3Db.

As shown in FIG. 2, when viewed from the Z direction, the second extending portion 4Bb extends from the second portion 42 of the second connection portion 4Ba so as to surround the four side portions 31a of the optical layer 31 of the second cell 3Db. The second extending portion 4Bb is in contact with the outer portion 35 of the second semiconductor layer 33 of the second cell 3Db through the opening 5a. In this example, the second extending portion 4Bb has four portions 43a, 43b, 43c, and 43d extending straight along the four side portions 31a, respectively. The portion 43a is connected to the second portion 42 of the second connection portion 4Ba. The first end of the portion 43b is connected to the first end of the portion 43a, and the portion 43b extends perpendicular to the portion 43a. The portion 43c is connected to the second end of the portion 43b, and extends perpendicular to the portion 43b and parallel to the portion 43a. The portion 43d is connected to the second end of the portion 43a, and extends perpendicular to the portion 43a and parallel to the portion 43b. In this example, the portion 43d is not connected to the portion 43c, and a gap is formed between the portions 43c and 43d when viewed from the Z direction. That is, the second extending portion 4Bb partially surrounds the four side portions 31a of the optical layer 31 of the second cell 3Db, and does not surround the entire circumference of the optical layer 31 of the second cell 3Db. The second extending portion 4Bb extends along at least a part of each of the four side portions 31a when viewed from the Z direction. As will be described later, the first connection portion 4Aa of the first wiring layer 4A is arranged in the gap between the portions 43c and 43d.

In the present embodiment, the first connection portion 4Aa of the first wiring layer 4A does not overlap the second extending portion 4Bb of the second wiring layer 4B when viewed from the Z direction. The second portion 42 of the first connection portion 4Aa of the first wiring layer 4A is arranged so as to pass through the gap formed between the portions 43c and 43d of the second wiring layer 4B when viewed from the Z direction.

Figure 5:
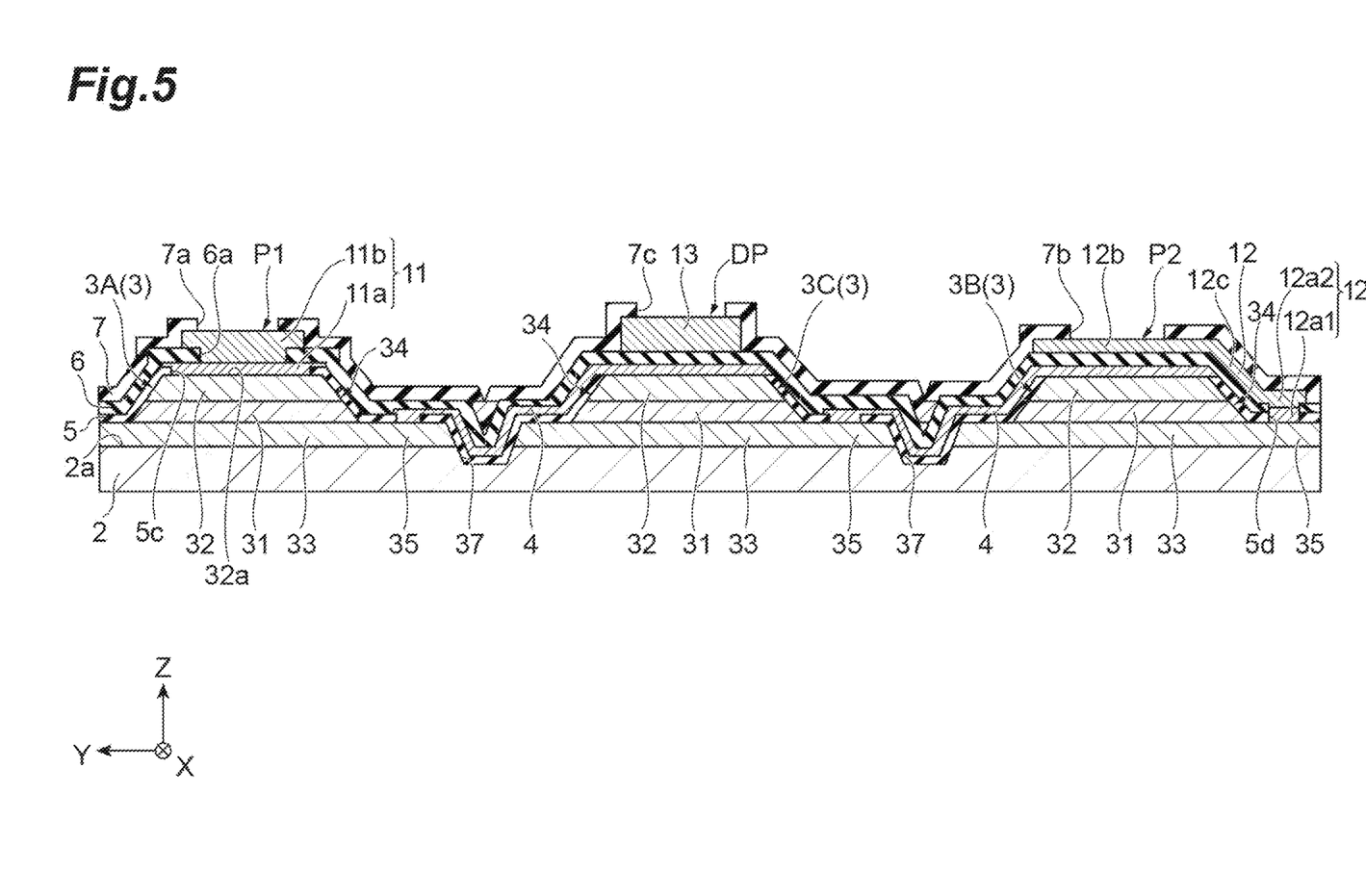
FIG. 5 is a diagram for explaining the cross-sectional structure of the optical semiconductor element.

Subsequently, the configurations of the first termination cell 3A, the second termination cell 3B, and the dummy pad cell 3C will be described with reference to FIGS. 1, 3, and 5. The first termination cell 3A, the second termination cell 3B, and the dummy pad cell 3C have the same configuration as the cell 3D except for the matters described below. In FIG. 5, for convenience of explanation, the first termination cell 3A, the second termination cell 3B, and the dummy pad cell 3C are shown side by side virtually.

The first termination cell 3A is the cell 3 arranged at one end of the electrically series connection, and the second termination cell 3B is the cell 3 arranged at the other end of the electrically series connection. The first termination cell 3A and the second termination cell 3B are electrically connected to the adjacent cell 3 by the wiring layer 4.

A first electrode (anode) 11 is arranged on the top surface of the first termination cell 3A (top surface of the mesa portion 34). The first electrode 11 is electrically connected to the first semiconductor layer 32 of the first termination cell 3A. The first electrode 11 has a lower portion 11a arranged on the surface 32a of the first semiconductor layer 32 and an upper portion 11b arranged on the lower portion 11a. The lower portion 11a is in contact with the first semiconductor layer 32 of the first termination cell 3A through the opening 5c formed in the first insulating layer 5. The upper portion 11b is arranged in an opening 6a formed in the second insulating layer 6, and is exposed to the outside of the optical semiconductor element 1 from an opening 7a formed in the third insulating layer 7. The exposed portion in the upper portion 11b forms a first pad portion P1 for electrical connection with an external member 50 described later. In FIG. 1, the first pad portion P1 is shown by a broken line. In this example, when viewed from the Z direction, the first electrode 11 is formed in a rectangular shape, and the first pad portion P1 is formed in a circular shape. The first pad portion P1 is not limited to the circular shape, and may be formed in any shape such as a rectangular shape.

The lower portion 11a is formed by stacking a first layer formed of Ti, a second layer formed of Pt, and a third layer formed of Au on the surface 32a in this order by vapor deposition. That is, the lower portion 11a has a three-layer structure similar to that of the wiring layer 4 described above. The upper portion 11b has a three-layer structure similar to that of the lower portion 11a and the wiring layer 4. Since the second layer formed of Pt is provided, it is possible to suppress the occurrence of a situation (solder erosion, solder corrosion) in which the solder flows to the third layer of the lower portion 11a when the external member 50 is connected to the first pad portion P1 by soldering as described later. That is, if the second layer is not provided, a phenomenon called solder erosion may occur and the solder may flow to the third layer of the lower portion 11a. However, by providing the second layer formed of Pt, it is possible to prevent the solder from flowing to the third layer of the lower portion 11a, so that it is possible to keep the flow of the solder to the third layer of the upper portion 11b. As a result, it is possible to satisfactorily control the shape of the solder.

A second electrode (cathode) 12 is arranged on the top surface of the second termination cell 3B (top surface of the mesa portion 34). The second electrode 12 is electrically connected to the second semiconductor layer 33 of the second termination cell 3B. The second electrode 12 has a first portion 12a, a second portion 12b, and a connection portion 12c. The first portion 12a is electrically connected to the outer portion 35 of the second semiconductor layer 33 of the second termination cell 3B through an opening 5d formed in the first insulating layer 5. The second portion 12b is arranged on the second insulating layer 6 so as to overlap the top surface of the mesa portion 34 when viewed from the Z direction. The connection portion 12c is electrically connected to the first portion 12a and the second portion 12b. The second portion 12b is exposed to the outside of the optical semiconductor element 1 through an opening 7b formed in the third insulating layer 7. The exposed portion in the second portion 12b forms a second pad portion P2 for electrical connection with the external member 50. In FIG. 1, the second pad portion P2 is shown by a broken line. In this example, the second portion 12b and the second pad portion P2 are formed in a circular shape when viewed from the Z direction.

The first portion 12a has a lower portion 12a1 arranged on the outer portion 35 of the second semiconductor layer 33 of the second termination cell 3B and an upper portion 12a2 arranged on the lower portion 12a1. The lower portion 12a1 has a three-layer structure similar to that of the lower portion 11a of the first electrode 11. The upper portion 12a2, the second portion 12b, and the connection portion 12c have a three-layer structure similar to that of the lower portions 11a and 12a1.

As shown in FIG. 3, the first portion 12a has an extending portion (third extending portion) 15. The extending portion 15 extends so as to surround the four side portions 31a of the optical layer 31 of the second termination cell 3B when viewed from the Z direction. In this example, the extending portion 15 has four portions 15a, 15b, 15c, and 15d extending straight along the four side portions 31a, respectively. The portion 15a is connected to the connection portion 12c. The first end of the portion 15b is connected to the first end of the portion 15a, and the portion 15b extends perpendicular to the portion 15a. The portion 15c is connected to the second end of the portion 15b, and extends perpendicular to the portion 15b and parallel to the portion 15a. The portion 15d is connected to the second end of the portion 15a, and extends perpendicular to the portion 15a and parallel to the portion 15b. In this example, the portion 15d is not connected to the portion 15c, and a gap is formed between the portions 15c and 15d when viewed from the Z direction. That is, the extending portion 15 partially surrounds the four side portions 31a of the optical layer 31 of the second termination cell 3B, and does not surround the entire circumference of the optical layer 31 of the second termination cell 3B. The extending portion 15 extends along at least a part of each of the four side portions 31a when viewed from the Z direction. A connection portion of the wiring layer 4 is arranged in the gap between the portions 15c and 15d. The extending portion 15 does not overlap the connection portion of the wiring layer 4 when viewed from the Z direction.

A dummy electrode 13 is arranged on the top surface of the dummy pad cell 3C (top surface of the mesa portion 34). The dummy electrode 13 is arranged on the second insulating layer 6 so as to overlap the first semiconductor layer 32 in the Z direction. The dummy electrode 13 has, for example, a layer structure similar to that of the lower portion 11a of the first electrode 11. The dummy electrode 13 is electrically separated (insulated) from the optical layer 31, the first semiconductor layer 32, and the second semiconductor layer 33 of the dummy pad cell 3C by the second insulating layer 6. The dummy electrode 13 is exposed to the outside of the optical semiconductor element 1 through an opening 7c formed in the third insulating layer 7. The exposed portion in the dummy electrode 13 forms a dummy pad portion DP. In FIG. 1, the dummy pad portion DP is shown by a broken line. The dummy pad portion DP is formed in a circular shape when viewed from the Z direction, but may be formed in any shape such as a rectangular shape.

The external member 50 is connected to the dummy pad portion DP by solder as in the case of the first pad portion P1 and the second pad portion P2. However, as described above, unlike the first pad portion P1 and the second pad portion P2, the dummy pad portion DP is electrically insulated from the optical layer 31, the first semiconductor layer 32, and the second semiconductor layer 33 of the dummy pad cell 3C.

Figure 6:
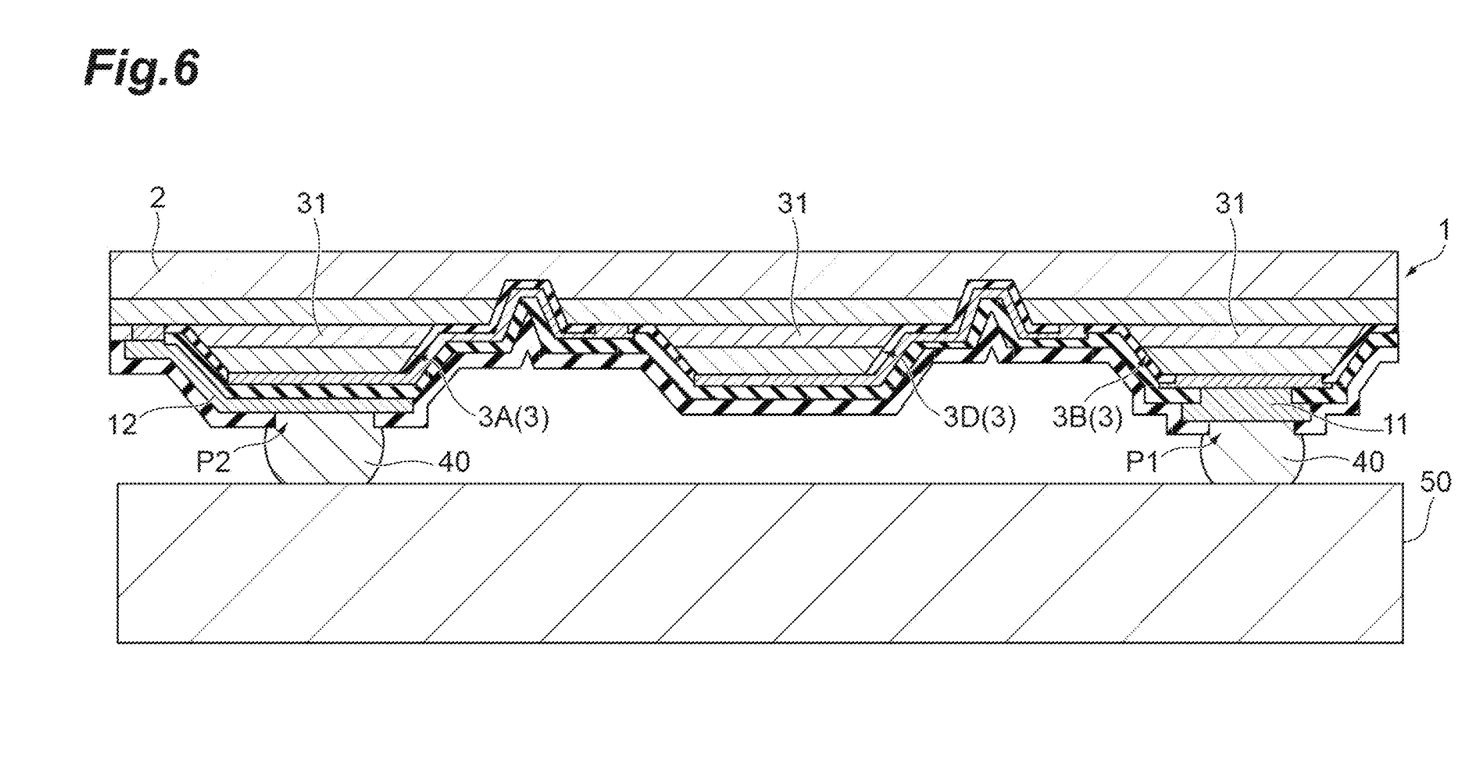
FIG. 6 is a cross-sectional view showing a state in which an optical semiconductor element is mounted.

FIG. 6 is a cross-sectional view showing a state in which the optical semiconductor element 1 is mounted. FIG. 4 shows an example in which the optical semiconductor element 1 is electrically connected to the external member 50 by solder (bump, bonding material) 40. In this example, each of the first pad portion P1 and the second pad portion P2 is connected to the external member 50 by the solder 40. In addition, although not shown, the dummy pad portion DP is connected to the external member 50 by the solder 40. During operation of the optical semiconductor element 1, a voltage is applied between the first pad portion P1 (first electrode 11) and the second pad portion P2 (second electrode 12) through the external member 50. As a result, in each cell 3, carriers are injected into the optical layer 31 to generate light, and the generated light is emitted through the substrate 2. In addition, instead of the solder 40, an Au bump or an In bump may be used as a bonding material.

[Functions and Effects]

In the optical semiconductor element 1, the optical layer 31 is an active layer that generates light having a central wavelength of 3 μm or more and 10 μm or less. In this case, as described above, the carrier injection efficiency may be reduced, and it is important to increase the light emission efficiency per unit area. The latter is due to the high price of a wafer (in which each layer, electrode, and insulating layer are formed on the substrate 2) used for forming the optical semiconductor element 1. In this respect, in the optical semiconductor element 1, a plurality of cells 3 are formed on the substrate 2. Therefore, for example, compared with a case where only one cell 3 is formed on the substrate 2, the size of one cell 3 can be reduced. As a result, it is possible to suppress a reduction in carrier injection efficiency. In addition, the optical layer 31 of each cell 3 is formed in a rectangular shape when viewed from the Z direction. Therefore, a plurality of cells 3 can be efficiently arranged on the substrate 2, and it is possible to increase the light emission efficiency per unit area. Arranging a plurality of cells 3 as described above is particularly effective when the output per cell 3 is reduced by reducing the size of one cell 3. In addition, in the optical semiconductor element 1, the first wiring layer 4A has the first connection portion 4Aa that electrically connects the second semiconductor layer 33 of the first cell 3Da and the first semiconductor layer 32 of the second cell 3Db to each other and the first extending portion 4Ab that extends so as to surround the four side portions 31a of the optical layer 31 of the first cell 3Da when viewed from the Z direction (thickness direction of the substrate 2). As a result, it is possible to more effectively suppress the reduction in carrier injection efficiency, and it is possible to increase the light emission efficiency in the central portion of the cell 3. In addition, the entire cell can emit light uniformly. Therefore, according to the optical semiconductor element 1, it is possible to suppress a reduction in carrier injection efficiency and increase the light emission efficiency per unit area.

The first connection portion 4Aa of the first wiring layer 4A does not overlap the second extending portion 4Bb of the second wiring layer 4B when viewed from the Z direction. Therefore, it is possible to avoid a situation in which the first wiring layer 4A and the second wiring layer 4B overlap each other to generate a capacitance.

A plurality of cells 3 are electrically connected in series. Therefore, it is possible to suppress an increase in the amount of current required for driving the plurality of cells 3, and it is possible to make the amount of current applied to each cell 3 uniform. That is, for example, when the optical semiconductor element 1 is driven by a constant current but a plurality of cells 3 are connected in parallel, the amount of current required for driving increases and the amount of current applied to each cell 3 changes. In addition, for example, when a plurality of cells 3 are connected in parallel, there is a place where the wiring layer 4 cannot be formed so as to have an extending portion due to the wiring routing, and as a result, the carrier injection efficiency may be reduced. However, by connecting the plurality of cells 3 in series, it is possible to suppress the occurrence of such a situation.

The first electrode 11 electrically connected to the first semiconductor layer 32 of the first termination cell 3A is arranged on the top surface of the first termination cell 3A, and the second electrode 12 electrically connected to the second semiconductor layer 33 of the termination cell 3B is arranged on the top surface of the second termination cell 3B. Therefore, all of the plurality of cells 3 can be made to emit light by electrical connection through the first electrode 11 and the second electrode 12. As a result, it is possible to increase the light emission efficiency. In addition, since the first electrode 11 is arranged on the top surface of the first termination cell 3A and the second electrode 12 is arranged on the top surface of the second termination cell 3B, it is possible to easily connect the external member 50 to the first electrode 11 and the second electrode 12.

The second electrode 12 has the extending portion 15 (third extending portion) that extends so as to surround the four side portions 31a of the optical layer 31 of the second termination cell 3B when viewed from the Z direction. Therefore, it is possible to suppress a reduction in carrier injection efficiency in the second termination cell 3B.

The dummy electrode 13 electrically separated from the optical layer 31, the first semiconductor layer 32, and the second semiconductor layer 33 of the dummy pad cell 3C is arranged on the top surface of the dummy pad cell 3C. Therefore, for example, by connecting the optical semiconductor element 1 to the external member 50 not only in the first electrode 11 and the second electrode 12 but also in the dummy electrode 13, it is possible to increase the connection strength between the optical semiconductor element 1 and the external member 50, and it is possible to suppress the occurrence of a situation in which the angle between the optical semiconductor element 1 and the external member 50 deviates from the target angle at the time of connection.

The optical layer 31 is formed of a material containing AlInAs and InAsSb. Therefore, the optical layer 31 can be configured as an active layer that generates light having a central wavelength of 3 μm or more and 10 μm or less.

The substrate 2 has a light transmission property, and the light generated in the optical layer 31 is emitted through the substrate 2. Therefore, light can be emitted through the substrate 2.

The first extending portion 4Ab includes the four portions 43a to 43d extending straight along the four side portions 31a, respectively, when viewed from the Z direction. Therefore, it is possible to more effectively suppress the reduction in carrier injection efficiency.

MODIFICATION EXAMPLES

Figure 7:
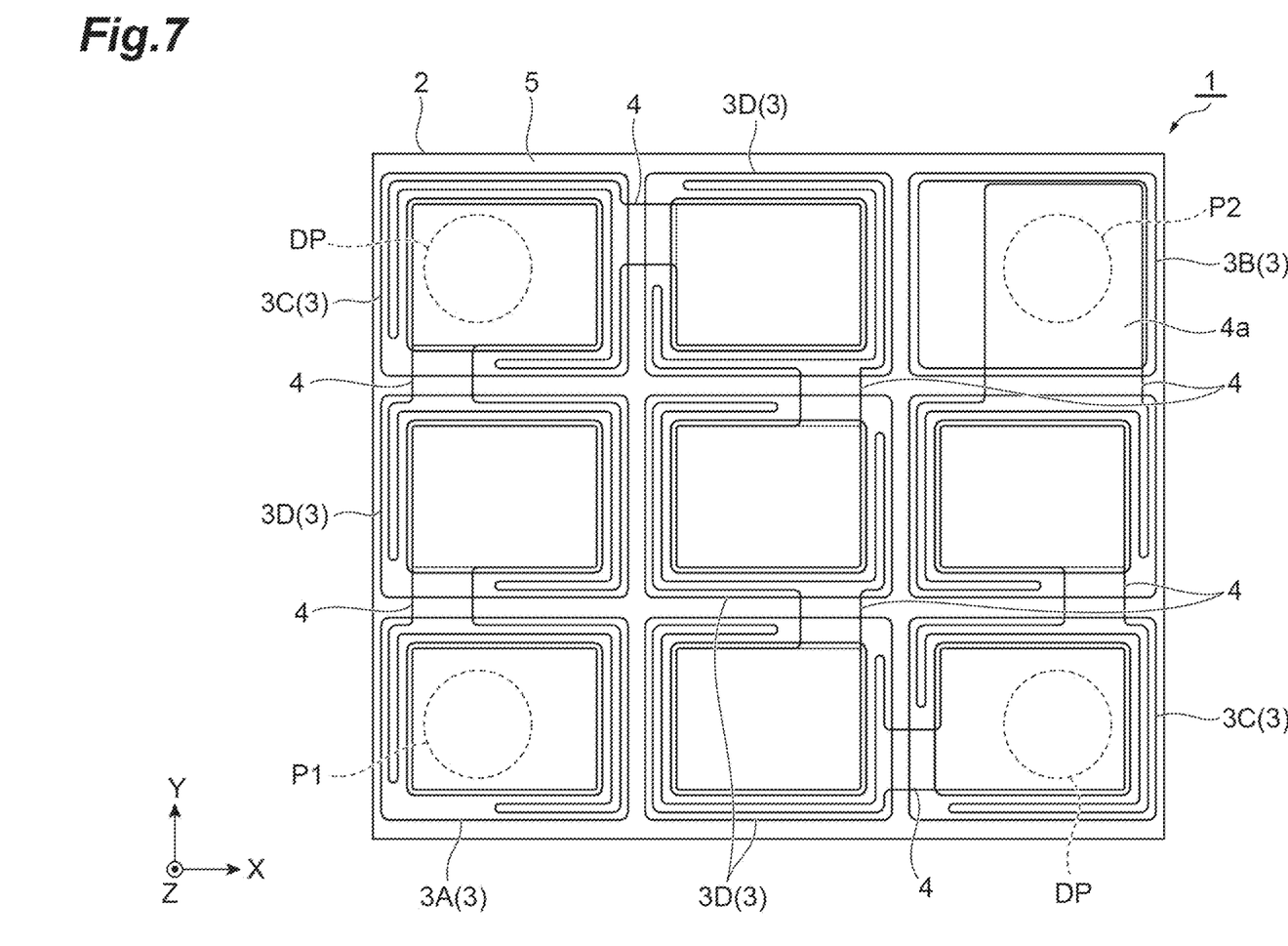
FIG. 7 is a plan view of an optical semiconductor element of a modification example.

In a modification example shown in FIG. 7, the second electrode 12 is not provided in the second termination cell 3B, and the second pad portion P2 is formed by the connection portion 4a of the wiring layer 4 exposed from the openings formed in the second insulating layer 6 and the third insulating layer 7. In FIG. 7, the second pad portion P2 is shown by a broken line. In this modification example, the second termination cell 3B does not emit light. Also in such a modification example, similar to the embodiment described above, it is possible to suppress the reduction in carrier injection efficiency and increase the light emission efficiency per unit area.

In case the second termination cell 3B does not emit light, the second termination cell 3B may have any structure. For example, an insulating layer may be provided between the wiring layer 4 and the first semiconductor layer 32 of the second termination cell 3B. Alternatively, the second termination cell 3B may not include the first semiconductor layer 32 and the optical layer 31, and the wiring layer 4 may be directly provided on the second semiconductor layer 33. That is, the plurality of cells 3 may include a terminal cell that does not emit light (for example, the second termination cell 3B) and light emitting cells that can emit light (for example, cells 3 other than the second termination cell 3B). The light emitting cells include the optical layer 31, the first semiconductor layer 32, and the second semiconductor layer 33. The termination cell includes at least the second semiconductor layer 33.

Alternatively, it can be regarded that the optical semiconductor element 1 includes a termination cell (for example, the second termination cell 3B) in addition to the plurality of cells 3. In this case, the terminal cell is a cell electrically connected to the cell of the plurality of cells 3 which is arranged at one end in the electrical series connection. The termination cell includes at least the second semiconductor layer 33 disposed on the substrate 2, and an electrode (for example, the second electrode 12) for electrical connection with an outside of the optical semiconductor element (for example, external circuit) is arranged on the top surface of the termination cell. This electrode may or may not be electrically connected to the second semiconductor layer 33 of the termination cell. The terminal cell may be a cell that includes the optical layer 31, the first semiconductor layer 32, and the second semiconductor layer 33 and can emit light or may be a cell that includes the second semiconductor layer 33 only and does not emit light. Alternatively, the wiring layer 4 may be directly formed on the substrate 2 without providing the second terminal cell 3B. In this case, a portion of the wiring layer 4 located inside the region where the second termination cell 3B was formed can be used as an electrode. That is, the optical semiconductor element 1 may include an electrode arranged on the substrate 2 instead of the second termination cell 3B. This electrode is electrically connected to the cell of the plurality of cells 3 which is arranged at one end in the electrical series connection.

That is, the optical semiconductor element may include a termination cell electrically connected to a cell of the plurality of cells which is arranged at one end in an electrical connection of the plurality of cells, the termination cell may include at least the second semiconductor layer arranged on the substrate, and an electrode for electrical connection with an outside may be arranged on a top surface of the termination cell. In this case, since at least the second semiconductor layer is arranged on the substrate, the difference in height between the termination cell and the other cells (plurality of cells) can be reduced, and as a result, the optical semiconductor element can be easily mounted.

In this case, the termination cell may include the optical layer, the first semiconductor layer, and the second semiconductor layer, and the electrode may be electrically connected to the second semiconductor layer of the termination cell. In this case, since the optical layer, the first semiconductor layer, and the second semiconductor layer are arranged on the substrate, the difference in height between the termination cell and the other cells (plurality of cells) can be further reduced, and as a result, the optical semiconductor element can be further easily mounted. In addition, since the termination cell can emit light in case the electrode and the first semiconductor layer are insulated from each other in the above-described structure, the light emission efficiency of the optical semiconductor element can be improved. In addition, when the shape of the optical semiconductor element or the external device changes (expands or contracts) due to a temperature change, a load is likely to be concentrated on a portion having a different height and a failure is likely to occur. However, since the termination cell includes the optical layer, the first semiconductor layer, and the second semiconductor layer similarly to the other cells, the load concentration is less likely to occur.

Alternatively, the termination cell may include the second semiconductor layer only, and the electrode may be electrically connected to the second semiconductor layer of the termination cell. In this case, compared to the configuration in which the termination cell can emit light, the structure of the optical semiconductor element can be simplified.

The optical semiconductor element may include an electrode arranged on the substrate, and the electrode may be electrically connected to a cell of the plurality of cells which is arranged at one end in an electrical connection of the plurality of cells. In this case, compared to the configuration in which the termination cell can emit light, the structure of the optical semiconductor element can be simplified.

The present disclosure is not limited to the embodiment and the modification example described above. For example, the material and shape of each component are not limited to the materials and shapes described above, and various materials and shapes can be adopted. In the embodiment described above, the optical layer 31 has a multiple quantum well structure, but the optical layer 31 may be configured by a single layer. The material of the optical layer 31 is not limited to the example in the embodiment described above, and the optical layer 31 may be formed of a material containing at least one of InAsSb, AlInSb, and AlInAs. The optical layer 31 may be formed of a material containing Sb and In. The optical layer 31 may be formed of a material containing Sb. Even in these cases, the optical layer 31 can be configured as an active layer that generates light having a central wavelength of 3 μm or more and 10 μm or less. The optical layer 31 may be an active layer that generates light having a central wavelength of 3 μm or more and 8 μm or less, or may be an absorption layer having a maximum sensitivity wavelength of 3 μm or more and 8 μm or less. The wiring layer 4, the first electrode 11, and the second electrode 12 may be formed of a metal material other than those described above. The wiring layer 4 does not necessarily have to be formed in a layered shape.

In the embodiment described above, the second extending portion 4Bb of the second wiring layer 4B partially surrounds the four side portions 31a of the optical layer 31 of the second cell 3Db, but the second extending portion 4Bb may surround the entire circumference of the optical layer 31. In other words, the second extending portion 4Bb may surround the entire four side portions 31a of the optical layer 31. For example, in the embodiment described above, the portions 43c and 43d of the second extending portion 4Bb may be connected to each other, and the second extending portion 4Bb may be formed in a rectangular ring shape when viewed from the Z direction. In this case, for example, by making the plane on which the first connection portion 4Aa of the first wiring layer 4A is arranged different from the plane on which the second extending portion 4Bb of the second wiring layer 4B is arranged, the first connection portion 4Aa and the second extending portion 4Bb are arranged so as to three-dimensionally cross (straddle) each other. In this case, the first connection portion 4Aa and the second extending portion 4Bb have portions overlapping each other when viewed from the Z direction.

In the embodiment described above, the second extending portion 4Bb extends in two different directions (In FIG. 2, the direction surrounding the optical layer 31 clockwise and the direction surrounding the optical layer 31 counterclockwise) starting from the intersection with the second portion 42 of the second connection portion 4Ba. However, when the second extending portion 4Bb partially surrounds the four side portions 31a of the optical layer 31 of the second cell 3Db, the second extending portion 4Bb may extend in only one direction starting from the intersection with the second portion 42. Also in this case, the first connection portion 4Aa and the second extending portion 4Bb have portions overlapping each other when viewed from the Z direction. When the second extending portion 4Bb extends in two different directions starting from the intersection with the second portion 42, it is possible to shorten the length from the intersection with the second portion 42 to the distal end in the second extending portion 4Bb as compared with a case where the second extending portion 4Bb extends in only one direction. Therefore, since it is possible to increase the efficiency of carrier injection into the optical layer 31, it is possible to improve the light emission efficiency.

As another modification example, the optical semiconductor element 1 may be configured as a light receiving element. In this modification example, the optical semiconductor element 1 is configured as, for example, a photodiode. The optical layer 31 is an absorption layer that absorbs light, and is configured to have a maximum sensitivity wavelength of, for example, 3 μm or more and 10 μm or less. The optical layer 31 is configured in the same manner as the optical layer 31 of the embodiment described above, for example. In each cell 3, light incident through the substrate 2 is absorbed by the optical layer 31, and carriers are generated in the optical layer 31. The generated carriers are extracted through the first pad portion P1 (first electrode 11) and the second pad portion P2 (second electrode 12).

According to this modification example, for the same reason as in the embodiment described above, it is possible to suppress a reduction in carrier extraction efficiency and increase the light reception efficiency per unit area. In addition, when the optical semiconductor element 1 is a light receiving element, if a plurality of cells 3 are electrically connected in series to each other, the resistance value of the optical semiconductor element 1 can be set to a value suitable for connection with an amplifier connected subsequently. That is, the optical semiconductor element 1 having a maximum sensitivity wavelength in the mid-infrared region has a small resistance value. The amplifier has a resistance value suitable for connection, and in order to increase the resistance to about the resistance value, the optical semiconductor element 1 adopts a structure in which a plurality of cells 3 are connected in series. If the resistance value of the optical semiconductor element 1 is too smaller than the target value, noise is large and accordingly, the signal is easily buried in the noise. In addition, when the optical semiconductor element 1 is a light receiving element, if a plurality of cells 3 are electrically connected in series, thermal noise can be reduced. As a result, the total noise can be reduced. In a photodiode having sensitivity in the mid-infrared region, it is particularly important how the thermal noise can be reduced. More specifically, as the number of cells 3 connected in series increases, thermal noise is suppressed. The smaller the size of the optical semiconductor element 1, the more optical semiconductor elements 1 can be connected in series.

In the embodiment described above, the mesa portion 34 is formed in a trapezoidal shape in the cross section perpendicular to the main surface 2a of the substrate 2 (FIG. 4), but the mesa portion 34 may be formed in a rectangular shape in the cross section. In this case, the side surface of the mesa portion 34 may extend along the Z direction.

The material of each component is not limited to those described above. As an example, the substrate 2 may be formed of Si. The bather layer of the first semiconductor layer 32 may be formed of $(AlGa)_{0.20}In_{0.80}As$, and the buffer layer and the contact layer of the first semiconductor layer 32 may be formed of $In_{0.87}GaAs$. The buffer layer of the second semiconductor layer 33 may be formed to have three layers formed of GaAs, low temperature InAs, and $In_{0.87}GaAs$, respectively, the contact layer and the current diffusion layer of the second semiconductor layer 33 may be formed of $In_{0.87}GaAs$, and the barrier layer of the second semiconductor layer 33 may be formed of $(AlGa)_{0.20}In_{0.80}As$. The first insulating layer 5 and the second insulating layer 6 may be formed of $SiO_2$. As another example, the substrate 2 may be formed of SI—InP. The barrier layer of the first semiconductor layer 32 may be formed of $Al_{0.15}InAs$, and the buffer layer and the contact layer of the first semiconductor layer 32 may be formed of InAs. The buffer layer of the second semiconductor layer 33 may be formed to have three layers formed of GaAs, low temperature InAs, and InAs, respectively, the contact layer and the current diffusion layer of the second semiconductor layer 33 may be formed of InAs, and the barrier layer of the second semiconductor layer 33 may be formed of $Al_{0.15}InAs$. The first insulating layer 5 and the second insulating layer 6 may be formed of SiN. As another example, the buffer layer of the second semiconductor layer 33 may be formed to have three layers formed of GaAs, InAs, and $In_{0.87}GaAs$, respectively.

The substrate 2 may be formed in a square shape, a circular shape, an elliptical shape, or the like when viewed from the Z direction. The optical layer 31, the first semiconductor layer 32, and the second semiconductor layer 33 may be formed in a square shape, a circular shape, an elliptical shape, or the like when viewed from the Z direction. The first electrode 11 and the second electrode 12 may be formed in a square shape, a circular shape, an elliptical shape, or the like when viewed from the Z direction. The first connection portion 4Aa of the first wiring layer 4A is not limited to the rectangular shape, and may be formed in any shape. The first connection portion 4Aa does not necessarily have to be arranged on the approximately entire surface 32a, and at least a part of the first connection portion 4Aa may be arranged on the surface 32a. When the substrate 2 is formed in a rectangular shape when viewed from the Z direction and the cell 3 (optical layer 31) is formed in a rectangular shape when viewed from the Z direction, the cell 3 can be efficiently arranged on the substrate 2.

The first termination cell 3A and the second termination cell 3B do not necessarily have to be arranged diagonally on the substrate 2 when viewed from the Z direction, and may be arranged at any position. The dummy pad cell 3C may not be provided.

What is claimed is:

1. An optical semiconductor element, comprising:
   a substrate; and
   a plurality of cells formed on the substrate,
   wherein each of the plurality of cells includes an optical layer that is an active layer for generating light or an absorption layer for absorbing light, a first semiconductor layer arranged on a side opposite to the substrate with respect to the optical layer, and a second semiconductor layer arranged on a side of the substrate with respect to the optical layer,
   the optical layer is formed in a rectangular shape when viewed from a thickness direction of the substrate, and has four side portions,
   the plurality of cells include a first cell and a second cell, and the second semiconductor layer of the first cell and the first semiconductor layer of the second cell are electrically connected to each other by a first connection portion of a first wiring portion,
   the first wiring portion includes a first extending portion that extends from the first connection portion so as to surround the four side portions of the optical layer of the first cell when viewed from the thickness direction of the substrate, the optical layer is the active layer that generates light having a central wavelength of 3 um or more and 10 μm or less or the absorption layer having a maximum sensitivity wavelength of 3 μm or more and 10 μm or less, the substrate has a light transmission property, and when the optical layer is the active layer, light generated in the optical layer is emitted through the substrate, and when the optical layer is the absorption layer, light incident through the substrate is absorbed by the optical layer.

2. The optical semiconductor element according to claim 1, wherein the plurality of cells further include a third cell, the second semiconductor layer of the second cell and the first semiconductor layer of the third cell are electrically connected to each other by a second connection portion of a second wiring portion, the second wiring portion includes a second extending portion that extends from the second connection portion so as to surround the four side portions of the optical layer of the second cell when viewed from the thickness direction of the substrate, and the first connection portion of the first wiring portion does not overlap the second extending portion of the second wiring portion when viewed from the thickness direction of the substrate.

3. The optical semiconductor element according to claim 1, wherein the plurality of cells are electrically connected in series.

4. The optical semiconductor element according to claim 3, wherein the plurality of cells include a first termination cell arranged at one end in an electrical series connection and a second termination cell arranged at the other end in the electrical series connection, a first electrode electrically connected to the first semiconductor layer of the first termination cell is arranged on a top surface of the first termination cell, and a second electrode electrically connected to the second semiconductor layer of the second termination cell is arranged on a top surface of the second termination cell.

5. The optical semiconductor element according to claim 4, wherein the second electrode includes a third extending portion that extends so as to surround the four side portions of the optical layer of the second termination cell when viewed from the thickness direction of the substrate.

6. The optical semiconductor element according to claim 4, wherein the plurality of cells include a dummy pad cell, and a dummy electrode electrically separated from the optical layer, the first semiconductor layer, and the second semiconductor layer of the dummy pad cell is arranged on a top surface of the dummy pad cell.

7. The optical semiconductor element according to claim 1, wherein the optical layer is formed of a material containing Sb.

8. The optical semiconductor element according to claim 1, wherein the optical layer is formed of a material containing Sb and In.

9. The optical semiconductor element according to claim 1, wherein the optical layer is formed of a material containing at least one of InAsSb, AlInSb, and AlInAs.

10. The optical semiconductor element according to claim 1, wherein the first extending portion includes four portions extending straight along the four side portions, respectively, when viewed from the thickness direction of the substrate.

11. The optical semiconductor element according to claim 1, further comprising a termination cell electrically connected to a cell of the plurality of cells which is arranged at one end in an electrical connection of the plurality of cells, wherein the termination cell includes at least the second semiconductor layer arranged on the substrate, and an electrode for electrical connection with an outside is arranged on a top surface of the termination cell.

12. The optical semiconductor element according to claim 11, wherein the termination cell includes the optical layer, the first semiconductor layer, and the second semiconductor layer, and the electrode is electrically connected to the second semiconductor layer of the termination cell.

13. The optical semiconductor element according to claim 11, wherein the termination cell includes the second semiconductor layer only, and the electrode is electrically connected to the second semiconductor layer of the termination cell.

14. The optical semiconductor element according to claim 1, further comprising an electrode arranged on the substrate, wherein the electrode is electrically connected to a cell of the plurality of cells which is arranged at one end in an electrical connection of the plurality of cells.

15. An optical semiconductor element, comprising:

a substrate; and a plurality of cells formed on the substrate, wherein each of the plurality of cells includes an optical layer that is an active layer for generating light or an absorption layer for absorbing light, a first semiconductor layer arranged on a side opposite to the substrate with respect to the optical layer, and a second semiconductor layer arranged on a side of the substrate with respect to the optical layer, the optical layer is formed in a rectangular shape when viewed from a thickness direction of the substrate, and has four side portions, the plurality of cells include a first cell and a second cell, and the second semiconductor layer of the first cell and the first semiconductor layer of the second cell are electrically connected to each other by a first connection portion of a first wiring portion, the first wiring portion includes a first extending portion that extends from the first connection portion so as to surround the four side portions of the optical layer of the first cell when viewed from the thickness direction of the substrate, the optical layer is the active layer that generates light having a central wavelength of 3 μm or more and 10 μm or less or the absorption layer having a maximum sensitivity wavelength of 3 um or more and 10 µm or less, the plurality of cells are electrically connected in series, the plurality of cells include a first termination cell arranged at one end in an electrical series connection and a second termination cell arranged at the other end in the electrical series connection, a first electrode electrically connected to the first semiconductor layer of the first termination cell is arranged on a top surface of the first termination cell, a second electrode electrically connected to the second semiconductor layer of the second termination cell is arranged on a top surface of the second termination cell, the plurality of cells include a dummy pad cell, and a dummy electrode electrically separated from the optical layer, the first semiconductor layer, and the second semiconductor layer of the dummy pad cell is arranged on a top surface of the dummy pad cell.

16. The optical semiconductor element according to claim 15, wherein the plurality of cells further include a third cell, the second semiconductor layer of the second cell and the first semiconductor layer of the third cell are electrically connected to each other by a second connection portion of a second wiring portion, the second wiring portion includes a second extending portion that extends from the second connection portion so as to surround the four side portions of the optical layer of the second cell when viewed from the thickness direction of the substrate, and the first connection portion of the first wiring portion does not overlap the second extending portion of the second wiring portion when viewed from the thickness direction of the substrate.

17. The optical semiconductor element according to claim 15, further comprising a termination cell electrically connected to a cell of the plurality of cells which is arranged at one end in an electrical connection of the plurality of cells, wherein the termination cell includes at least the second semiconductor layer arranged on the substrate, and an electrode for electrical connection with an outside is arranged on a top surface of the termination cell.

18. An optical semiconductor element, comprising:

a substrate;

a plurality of cells formed on the substrate; and a termination cell electrically connected to a cell of the plurality of cells which is arranged at one end in an electrical connection of the plurality of cells, wherein each of the plurality of cells includes an optical layer that is an active layer for generating light or an absorption layer for absorbing light, a first semiconductor layer arranged on a side opposite to the substrate with respect to the optical layer, and a second semiconductor layer arranged on a side of the substrate with respect to the optical layer, the optical layer is formed in a rectangular shape when viewed from a thickness direction of the substrate, and has four side portions, the plurality of cells include a first cell and a second cell, and the second semiconductor layer of the first cell and the first semiconductor layer of the second cell are electrically connected to each other by a first connection portion of a first wiring portion, the first wiring portion includes a first extending portion that extends from the first connection portion so as to surround the four side portions of the optical layer of the first cell when viewed from the thickness direction of the substrate, the optical layer is the active layer that generates light having a central wavelength of 3 µm or more and 10 µm or less or the absorption layer having a maximum sensitivity wavelength of 3 µm or more and 10 µm or less, the termination cell includes at least the second semiconductor layer arranged on the substrate, an electrode for electrical connection with an outside is arranged on a top surface of the termination cell, the termination cell includes the second semiconductor layer only, and the electrode is electrically connected to the second semiconductor layer of the termination cell.

* * * * *